May 26, 1959 C. L. WANLASS 2,888,579

TRANSISTOR MULTIVIBRATOR

Filed March 7, 1955

INVENTOR.
CRAVENS L. WANLASS

BY William R. Lane

ATTORNEY 2,888,579
Patented May 26, 1959

2,888,579

TRANSISTOR MULTIVIBRATOR

Cravens L. Wanlass, Whittier, Calif., assignor to North American Aviation, Inc.

Application March 7, 1955, Serial No. 492,418

7 Claims. (Cl. 307—88.5)

Figure 1:
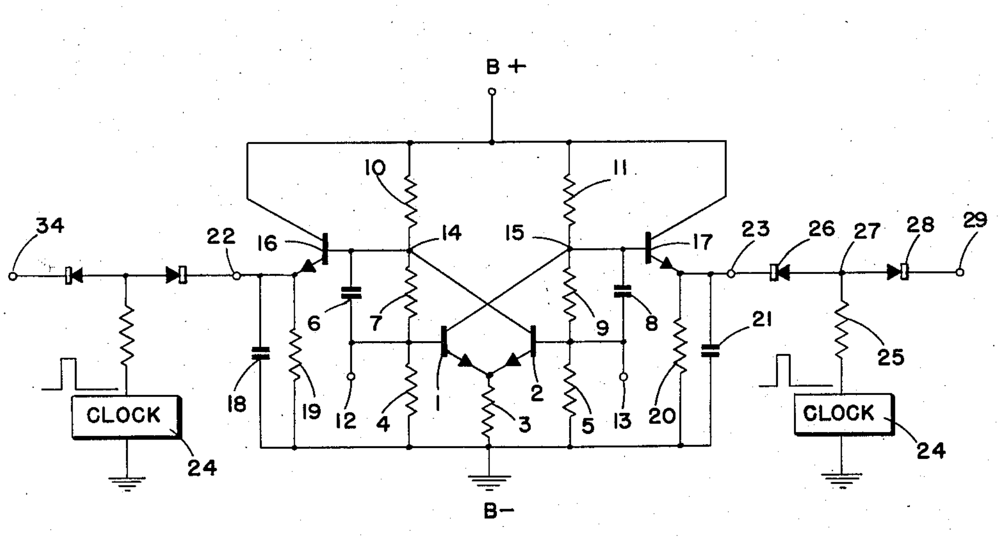

This invention relates to transistor multivibrators and in a particular embodiment of the invention to a transistor flip-flop.

This invention utilizes transistors to achieve reliability, compactness, low power requirements, low power dissipation, high efficiency, and mechanical rigidity. Where a large number of amplifying devices are required each of the above considerations becomes important. The invention disclosed herein requires a minimum number of electrical elements, the majority of them being resistors.

A multivibrator is, generally, an electronic device which may or may not require trigger pulse to provide an abrupt change from conduction by one tube or transistor to conduction by another; and, in order to employ this output most advantageously, it is necessary that the impedance of the multivibrator and the circuit it drives be comparable. A transistor is inherently a low impedance device which requires that it be operated into a low impedance circuit. The device of the invention includes a driver circuit which provides low output impedance to operate into a low impedance load. In the design of a multivibrator for use as a trigger circuit or as a flip-flop, attention must be given to the output requirements. A low impedance load may act to effect the reliable operation of or cause incorrect triggering of the multivibrator. It is therefore desirable to design a stable multivibrator which reliably responds to each trigger signal. A multivibrator is ordinarily composed of a pair of coupled amplifying devices such as transistors or tubes. At alternate intervals the output of one, which is conducting, is used to bias the other to cutoff and vice versa. Conventionally, bias is retained for a given length of time by use of delay time in an R.-C. circuit.

A non-conducting electronic tube held at cutoff by a control voltage exhibits high plate impedance. On the other hand, in some instances, a transistor exhibits relatively low impedance even when non-conducting. Additional means is necessary to provide a reliable control over the conduction or non-conduction of each transistor, or what is the same, over the state of multivibrator. The method of triggering a multivibrator is also important because such triggering method must operate to reliably initiate or terminate the conduction of one transistor or the other.

The frequency at which a trigger circuit operates satisfactorily is limited by the current-carrying capabilities and frequency response of the transistor. The frequency of operation and output power, then, are somewhat opposed to each other. This invention is a flip-flop of increased power output and increased frequency of reliable operation.

The invention herein described is one of simplicity and its reliability is not materially reduced by power being withdrawn from the circuit.

It is an object therefore of this invention to provide an improved multivibrator.

It is another object of this invention to provide a transistor multivibrator with improved control over the separate states of the multivibrator.

It is another object of this invention to provide a transistor multivibrator having a low output impedance.

It is a further object of this invention to provide an improved method of triggering a transistor multivibrator.

It is a still further object of this invention to provide a multivibrator less susceptible to signal variations and transient currents.

Figure 2:
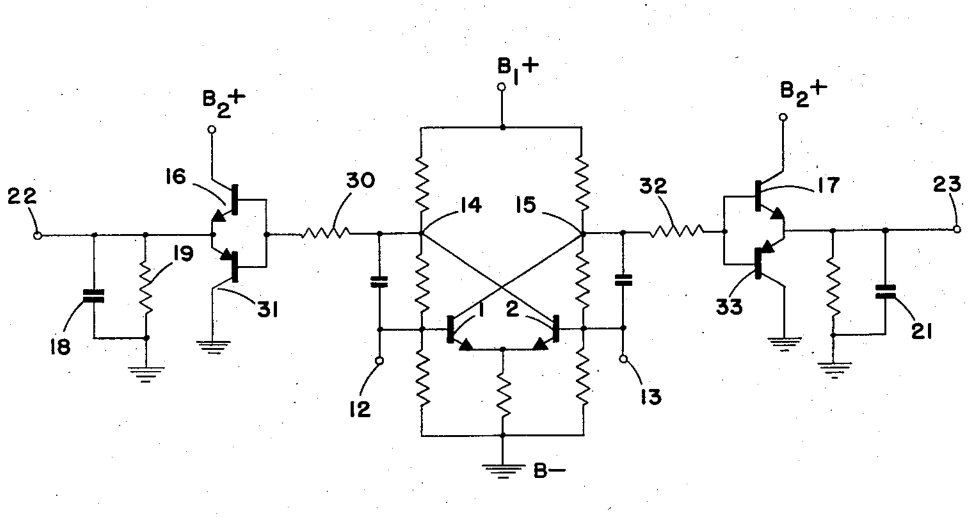

Other objects of invention will become apparent from the following description taken in connection with the accompanying drawings, in which Fig. 1 is a schematic of the device of the invention; and Fig. 2 is a schematic of an improved form of the device of the invention.

Referring to Fig. 1, the multivibrator is composed of transistors 1 and 2 whose emitters are connected through resistor 3 to ground. The base of each transistor is connected through a respective resistor, 4 and 5, to ground. The base of transistor 1 is connected through capacitor 6 and resistor 7 to the collector of transistor 2, and the base of transistor 2 is connected through capacitor 8 and resistor 9 to the collector of transistor 1. Resistors 10 and 11 connect the transistor collectors respectively to a B+ supply in the case of NPN transistors. If transistors 1 and 2 were PNP, the B+ supply connections would be reversed. The negative side of the B supply is connected to ground.

Thus far a complete multivibrator has been described. Assume the device to be bistable, that is, it has two stable states, and the input trigger pulse is a positive pulse received at terminal 13 to flip the circuit to one state or a positive pulse received at terminal 13 to flip the circuit to its other state. In one state, one transistor conducts, and in the other state, the other transistor conducts. Considering the arrow on each transistor to be pointed in the direction of conventional current flow, the base must be increased in potential to increase the respective transistor current flow. However, a negative pulse at terminal 12 is equivalent to a positive pulse at terminal 13 and vice versa by reason of the fact that the output potential at the collector of a collector loaded circuit is the inverse of the potential applied to the base of that transistor.

Assuming that transistor 1 is conducting and transistor 2 is not, a positive pulse received at terminal 13 causes transistor 2 to commence to conduct. The current flowing in transistor 2 causes point 14 to decrease in potential. Capacitor 6 couples this decrease in potential to the base of transistor 1 reducing its conductivity. This process continues until transistor 2 is fully conducting and transistor 1 is completely cut off.

Flipping this circuit to its opposite state is accomplished in the same manner, by a positive pulse received at terminal 12 which causes transistor 1 to commence conducting; point 15 then decreases in potential acting to shut off transistor 2. As each transistor continues to conduct, it maintains the other at cutoff by common resistor 3 and resistors 4, 5, 7 and 9, which holds the base of the non-conducting transistor at a lower potential than its emitter.

A driver output for the two states of the circuit is indicated by transistors 16 and 17 whose bases are connected to points 14 and 15, respectively, and whose conduction is thereby controlled. The collector of each transistor is connected directly to the B+ supply. The emitter of transistor 16 is connected through parallel resistor 19 and capacitor 18, to ground and the B− supply. Transistors 16 and 17, therefore, operate to charge their respective capacitors 18 and 21 in accordance with the state of the flip-flop as evidenced by whichever of the transistors 1 or 2 is conducting. The output is obtained at terminals 22 and 23 connected to the emitter of each transistor. If the charge on capacitors 18 or 21 is sampled over a short-pulsed interval, this device exhibits a low output impedance, and considerable current may be withdrawn from capacitors 18 and 21 by a short duration pulse because of their large values.

Assume the state of the flip-flop is such that transistor 17 causes capacitor 21 to be charged to a high or true state; therefore, clock 24 (a pulse generator), connected on one side to ground and on the other side through resistor 25 to diode 26, provides a short duration positive pulse which causes point 27 to become equal in potential to the voltage at point 23, and thus samples the flip-flop output. When point 27 becomes more positive, diode 28 is biased in a conducting direction and provides an output pulse at terminal 29 indicating the state of the flip-flop to be high or in the true state. A similar output circuit may be connected to terminal 22 using the same clock source. Output terminal 34 provides an output indicative of the alternate state of the flip-flop. If the flip-flop output is false or in the low state, point 27 does not go positive when the clock pulse is present since diode 26 conducts and allows current to pass from capacitor 21 through resistor 25 to the clock source. Therefore, when the output of the flip-flop is in the false or low state, no positive pulse will be received at point 29.

An alternate output driver is indicated in Fig. 2 which incorporates the same basic flip-flop and indicates a modification of the output circuit to charge and discharge more rapidly capacitors 18 and 21. Point 14 is connected through resistor 30 to the bases of transistors 16 and 31. Point 15 is connected through resistor 32 to the bases of transistors 17 and 33. Transistors 31 and 33 are of the PNP conduction type. A separate power supply $B_2+$ is connected to the collector of each transistor 16 and 17. The emitter of transistor 16 is connected to charge capacitor 18 across which is connected resistor 19. Transistor 31 is connected to discharge capacitor 18. Whereas, in the circuit of Fig. 1 resistor 19 was made as small as possible so that capacitor 18 could discharge rapidly (allowing the flip-flop to change states rapidly), there was a limit to how small resistor 19 could be made because of the maximum emitter current transistor 16 could carry. In the embodiment of Fig. 2, resistor 19 can be made very large (50K) and the average power requirements of the circuit are greatly reduced for a given size capacitor 18 and a given maximum operating frequency, since transistor 31 can discharge capacitor 18 rapidly. It is only when the flip-flop is changing from one state to another that a large amount of current is taken by the capacitor 18. The reliability of the circuit is also greatly increased since the average collector current of transistor 16 is much lower.

Transistor 17 is similarly connected to charge capacitor 21, and transistor 33 is connected in a manner to discharge capacitor 21. It is pointed out that transistor 33 conducts only to discharge capacitor 21 and only when transistor 17 is non-conducting. This occurs due to the fact that the transistor 17 is held to non-conduction by the same signal on its base which causes transistor 33 to conduct. Similar explanation applies to transistors 31 and 16.

The major advantage of the driver using two transistors, Fig. 2, over the circuit of Fig. 1 is that the output capacitor may be much larger since one transistor (NPN) charges the capacitor and the other transistor (PNP) of the output circuit discharges the capacitor. At one hundred kilocycle clock frequency, the two-transistor driver circuit will satisfactorily operate nearly ten times as many pulse receiving circuits as the device of Fig. 1.

Thus far, the circuit of the device has been considered as being bistable, or as a flip-flop. It is also possible that the same circuit could be operated in a monostable fashion, that is, a trigger pulse would cause one transistor to conduct and thereafter spontaneously, that transistor would cease conducting and the original transistor would again commence conducting. This could be obtained, for example, by changing the bias one transistor has upon the other while conducting. For example, one of resistors 4 or 5 might be increased in value, approximately doubled, depending upon which transistor it is desired to have ordinarily conduct. By increasing the base circuit resistance, the potential of the base electrode is changed and the current flowing through common resistor 3 is not sufficient to maintain the other transistor at cutoff, except for a short period.

In addition, a free-running multivibrator may be devised from the concept of the invention. In this case, transistor 1 conducts and shuts off; and then transistor 2 conducts and then shuts off; and transistor 1 commences conducting again, continuing in an oscillatory manner. This may be obtained by reducing the resistance of resistor 3 to a value at which the circuit becomes unstable. Increasing the resistance of both resistors 4 and 5 will also provide a free-running multivibrator. In this case, current flow in each transistor is cut down and is only able to maintain the other transistor at cutoff for a short time.

Typical circuit values are as follows:

B+=15 v.
$B_2+$=25 v.

Resistors:

| | |
|---|---|
| (3) 1.5K | (11) 15K |
| (4) 56K | (19) 3K |
| (5) 56K | (20) 3K |
| (7) 150K | (25) 15K |
| (9) 150K | (30) 5.1K |
| (10) 15K | (32) 5.1K |

Capacitors 6 and 8 are 68 micromicrofarads. Capacitors 18 and 21 are 1,000 micromicrofarads.

Transistors 1 and 2 may be replaced by PNP transistors, of course, in which event the B supply is reversed and the pulses received at input terminals 12 and 13 would be negative instead of positive.

An especial advantage of the device of the invention is the use of transistors in a quick-response multivibrator from which large currents can be drawn.

Although the invention has been described and illustrated in detail, it is to be clearly understood that the same is by way of illustration and example only and is not to be taken by way of limitation, the spirit and scope of this invention being limited only by the terms of the appended claims.

I claim:

1. In a transistor multivibrator, first and second transistors, each of said transistors having a base, a collector and an emitter; first and second resistor-capacitor circuits respectively connected between the collector of one transistor and the base of the other transistor; an impedance element commonly connected in the emitter circuits of both said transistors; a respective impedance connected in the collector circuits of said transistors and a respective base return circuit connected to each said transistor; a third and fourth transistor connected to be controlled, respectively, by the output of said first and second transistors; a third and fourth resistor-capacitor circuit connected to receive the output of said third and fourth transistors, respectively; and a fifth and sixth transistor connected to discharge said third and fourth resistor-capacitor circuit.

2. The combination recited in claim 1 wherein the conduction of said fifth and sixth transistors is controlled by the output of said first and second transistors, respectively.

3. The combination recited in claim 1 wherein said fifth and sixth transistors are of oppositely conductive types from said third and fourth transistors, respectively, and the conduction of said fifth and sixth transistors is controlled by the output of said first and second transistors.

4. In a transistor multivibrator, first and second transistors; first and second resistor-capacitor circuits comprising a resistor and capacitor in parallel connected between the collector of one transistor and the base of the other, respectively; an impedance element commonly connected in the emitter circuits of both said transistors; a respective impedance connected in the collector circuits of said transistors and a respective base return circuit connected to each said transistor; third and fourth transistors whose bases are connected to receive the collector voltage of said first and second transistors, respectively; and a third and fourth resistor-capacitor circuit comprising a resistor and capacitor in parallel connected in the emitter circuits of said third and fourth transistors, respectively; and wherein is further included a fifth and sixth transistor connected to discharge said third and fourth resistor-capacitor circuits, respectively; the base of said fifth and sixth transistors connected to receive the voltage of said first and second parallel resistor-capacitor circuits, respectively.

5. In combination a multivibrator having at least two outputs; a first transistor connected to be controlled by the first of said outputs; a second transistor connected to be controlled by the second output; a first capacitive storage circuit connected to receive and store the output of said first transistor; a second capacitive storage circuit connected to receive and store the output of said second transistor; a third transistor connected to be controlled by the first of said outputs of said multivibrator and connected to discharge said first capacitive storage circuit, a fourth transistor connected to be controlled by the second of said outputs of said multivibrator and connected to discharge said second capacitive storage circuit.

6. The combination recited in claim 5 wherein said third and fourth transistors are of oppositely conductive type from said first and second transistors respectively.

7. In a transistor multivibrator, first and second transistors; first and second resistor-capacitor circuits comprising a resistor and capacitor in parallel connected between the collector of one transistor and the base of the other, respectively; a resistor commonly connected in the emitter circuits of both said transistors; a respective resistor connected in the collector circuits of said transistors and a respective base return resistor connected to each said transistor; third and fourth transistors each of whose collector-to-base circuit, respectively, includes one of said resistors connected in the collector circuits of said first and second transistors; and a third and fourth resistor-capacitor circuit comprising a parallel resistor and capacitor connected in the emitter circuits of said third and fourth transistors, respectively, and a fifth and sixth transistor connected to discharge said third and fourth resistor-capacitor circuits, said fifth and sixth transistors being of oppositely conductive types from said third and fourth transistors; and the bases of said fifth and sixth transistors connected to be controlled by the output of said first and second transistors.

References Cited in the file of this patent

UNITED STATES PATENTS

| | | |
|---|---|---|
| 2,569,345 | Shea | Sept. 25, 1951 |
| 2,622,212 | Anderson et al. | Dec. 16, 1952 |
| 2,706,811 | Steele | Apr. 19, 1955 |
| 2,776,420 | Woll | Jan. 1, 1957 |
| 2,827,574 | Schneider | Mar. 18, 1958 |

OTHER REFERENCES

Sziklai: Transistor Circuits and Applications, Electronic Engineering, September 1953.